United States Patent [19]

Cotreau

[11] Patent Number: 5,572,162

[45] Date of Patent: Nov. 5, 1996

[54] FILTER WITH REDUCED ELEMENT RATINGS AND METHOD

[75] Inventor: Gerald M. Cotreau, Melbourne, Fla.

[73] Assignee: Harris Corporation, Melbourne, Fla.

[21] Appl. No.: 380,412

[22] Filed: Jan. 30, 1995

[51] Int. Cl.⁶ .................................................. G06F 7/556
[52] U.S. Cl. ..................... 327/552; 327/103; 327/350; 327/557; 327/559
[58] Field of Search ........................... 327/350, 103, 327/551–2, 557–9

[56] References Cited

U.S. PATENT DOCUMENTS

| | | | |
|---|---|---|---|
| 4,430,626 | 2/1984 | Adams | 327/552 |
| 5,126,586 | 6/1992 | Gilbert | 327/103 |
| 5,338,985 | 8/1994 | Fotowat-Ahmady et al. | 327/350 |
| 5,394,025 | 2/1995 | Pierson | 327/103 |

*Primary Examiner*—Margaret Rose Wambach
*Attorney, Agent, or Firm*—Rogers & Killeen

[57] ABSTRACT

An electronic filter for passing predetermined frequencies includes resistive and capacitive components that need not be rated to handle the input voltage. An input signal is converted to a second signal that is proportional to the logarithm of the input signal (and therefore of much smaller magnitude than the input signal), and then low, high, band-pass filtered with an RC filter. The filtered signal is reconverted to an output signal that is proportional to the inverse logarithm of the filtered signal. The filter may be embedded in a current mirror that may be used in telephone system subscriber line interface circuit.

28 Claims, 2 Drawing Sheets

FILTER WITH REDUCED ELEMENT RATINGS AND METHOD

BACKGROUND OF THE INVENTION

The present invention relates to electronic filters, and more particularly to devices and methods for filtering a signal in which the rating requirements of resistive and capacitive components in the filter are substantially reduced.

Electronic filters typically include resistive and capacitive components arranged in a circuit to pass particular frequencies (e.g., high pass, low pass, band pass, band rejection). By way of example, FIG. 1 depicts a low pass filter typical of the prior art; a first order filter that includes a resistor R and capacitor C that may be grounded if the filter is ground referenced, and in which $$\frac{Iout}{Iin} = \frac{1}{(1+sCR)} \quad (1)$$

Filters may also include inductive components, but their expense and size usually limits their use. However, even the size and expense of the resistive and capacitive components may present difficulties in the design and manufacture of electronic filters, and to this end it is desirable to reduce the size and cost of these components. As component size is generally equated to the component's capability—its rating, a typical solution has been to tradeoff capability or size in order to meet design requirements.

The size and cost of a resistor is a function of the power it must dissipate, and the size and cost of a capacitor is a function of the maximum voltage that will appear across the capacitor. Electronic systems with low voltage levels and small current levels can use small and relatively inexpensive resistors and capacitors. Other systems, such as a subscriber line interface circuit (SLIC) for a telephone system, are not so fortunate. A SLIC may operate with voltages as high as 60 volts and currents up to tens of milliamps. Further, filters for SLICs must operate in the audio band that further increases the size and capability required of their resistive and capacitive components.

Accordingly, it is an object of the present invention to provide a novel filter and method that obviates the problems of the prior art.

It is another object of the present invention to provide a novel filter and method in which the rating of resistive and capacitive components in the filter is less than would be required to accommodate the input signal.

It is yet another object of the present invention to provide a novel filter and method in which an input signal is converted to its logarithm before the input signal is filtered to thereby reduce the voltage and power requirements of filter components.

The present invention may find application in SLICs for telephone systems, and more particularly to current mirrors that are used in telephone systems. Current mirrors duplicate an input current by providing one or more reflections of the input current. Such devices are known and illustrated, by way of example, in FIG. 2 in which a pair of transistors Q1 and Q2 are mated to provide a single reflection, Iout. Current mirrors may be used in telephone system SLICs for a variety of purposes.

Accordingly, it is still another object of the present invention to provide a novel combination of a filter and a current mirror in which an input current is converted to a voltage proportional to the logarithm of the input current before being filtered, and thereafter reconverted to an output current proportional to the inverse logarithm of the filtered voltage.

It is a further object of the present invention to provide a novel filter for a telephone system subscriber line interface circuit that is embedded in a current mirror.

It is yet a further object of the present invention to provide a novel method and filter for an input current (a) in which a first bipolar junction transistor with a collector connected to receive the input current, a grounded emitter, and a base connected to an input of the filter and to the collector of the first transistor converts the input current to a first voltage that is proportional to the logarithm of the input current, (b) in which an RC filter with components not rated to handle the input current filters the first voltage, and (c) in which a second bipolar junction transistor with a base connected to receive the filtered first voltage from the RC filter, a grounded emitter, and a collector connected to an output, provides a filtered output current that is proportional to the inverse logarithm of the filtered first voltage.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 3:
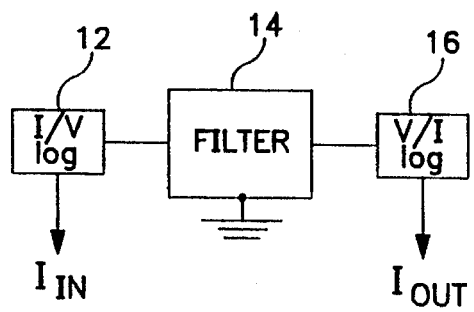
FIG. 3 is a block diagram of an embodiment of the present invent ion.

With reference now to FIG. 3, an embodiment of the present invention may include a current-to-voltage converter 12 for converting an input current Iin to a voltage that is proportional to the logarithm of the input current, a filter 14 for filtering the voltage, and a voltage-to-current converter 16 for converting the voltage to an output current Iout that is proportional to the inverse logarithm of the filtered voltage. The filter 14 level shifts the voltage to ground. The voltage and power requirements of the components of the filter 14 are significantly reduced because the voltage through the filter has been reduced proportional to the logarithm of the input current. While the filter herein is depicted as grounded, it will be appreciated by those of skill in the art that such indication includes reference to a dc voltage, and not just to ground.

Figure 1:
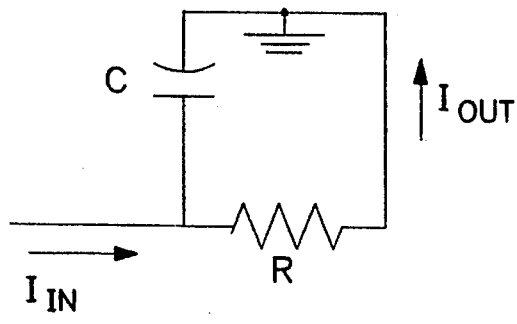
FIG. 1 is a circuit diagram of a low pass current mode filter of the prior art.
Figure 2:
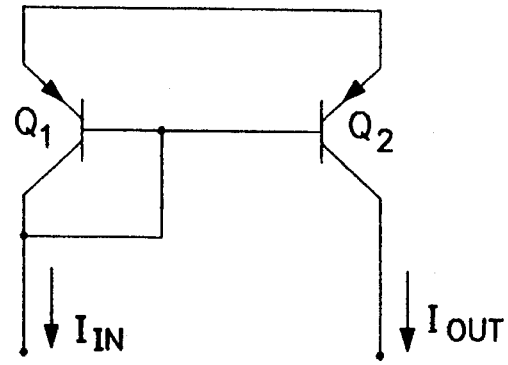
FIG. 2 is a circuit diagram of a current mirror of the prior art.
Figure 4:
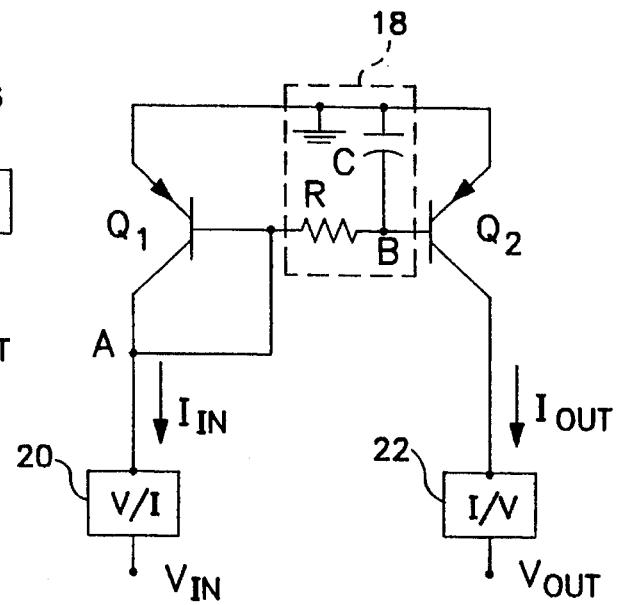
FIG. 4 is a circuit diagram of an embodiment of the filter of the present invention.

A preferred embodiment depicted in FIG. 4 may include a filter embedded in a current mirror. A transistor Q1 converts an input current Iin to a voltage that is filtered in filter 18 and thereafter reconverted to an output current by transistor Q2. Transistor Q1 has its collector connected to receive the input current Iin, a grounded emitter, and its base connected to an input to the filter 18 and to its collector. The voltage at node A is proportional to the natural logarithm of the input current Iin. The voltage at node A also appears at node B after having been filtered and level shifted to ground. The filter 18 may be a low pass, high pass, bandpass or band rejection filter of any order. The filter shown in FIG. 4 is a first order low pass RC filter that is typical of the filters used in telephone systems. The filtered voltage is provided to the base of transistor Q2 where it is reconverted to a current, Iout, that is proportional to the inverse natural logarithm of the voltage. Transistor Q2 has a grounded emitter and a collector that provides Iout. Note that the relationship between Iout and Iin is the same as in the filter of FIG. 1, $$\frac{Iout}{Iin} = \frac{1}{(1 + sCR)} \quad (2)$$

In the event the input is a voltage mode signal Vin, a voltage-to-current converter 20 may be provided. A current-to-voltage converter 22 may also be provided for a filtered voltage output Vout.

With continued reference to the embodiment in FIG. 4, a significant advantage of the present invention is the reduction of voltage through the filter 18. By way of illustration, consider a voltage mode input Vin of 50 volts. Heretofore, a filter for such an input would have to include capacitive components rated to handle 50 volts and resistive components rated to handle 0.5 watts. However, when Vin is converted to Iin of 1 ma (e.g., by a 50k Ω resistor in converter 20) and provided through transistors Q1 and Q2, the voltage at nodes A and B is reduced to only 0.6 volts. The capacitor C will carry only 0.6 volts instead of 50 volts, and the maximum power in resistor R will be only 50 microwatts instead of 0.5 watts (assuming beta is 100).

Figure 5:
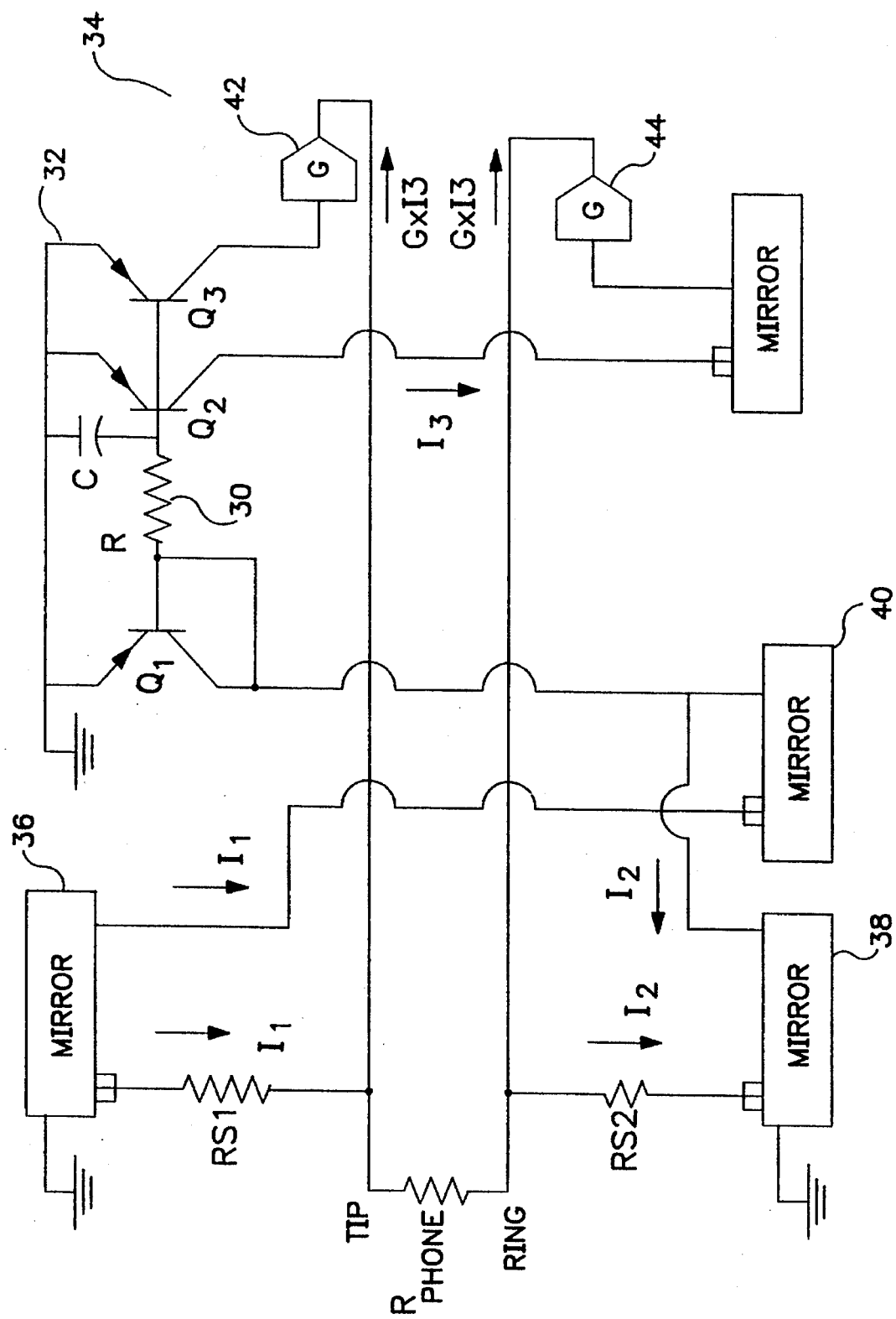
FIG. 5 is a circuit diagram of an embodiment of a battery feed circuit for a SLIC with an embodiment of the current mirror and filter combination of the present invention.

With reference now to FIG. 5, in a further preferred embodiment, a filter 30 may be embedded in a current mirror 32 in a SLIC 34 (only a battery feed circuit portion of the SLIC is shown in the interest of clarity). Current I1 is proportional to the voltage at the node labeled TIP and current I2 is proportional to the voltage at the node labeled RING. In the SLIC 34 the currents I1 and I2 may summed in current mirrors 36, 38 and 40 and then filtered in the filter 30 and current mirror 32 to provide filtered current I3. Two copies of I3 are provided by transistors Q2 and Q3 to current gain blocks 42 and 44 for amplification and feed back to TIP and RING. The SLIC 34 operates in current mode so voltage converters are not required. Were the SLIC to operate in voltage mode, converters may be added as needed. Current mirror 40 allows the filter 30 to be referenced to ground, and to have small dc and ac signal voltages across capacitor C. Mirror 40 level shifts the dc bias component to near zero. If mirror 40 were not used, and Q1 and Q2 were NPN transistors with emitters on the battery rail, capacitor C would have a dc voltage near battery level since the capacitor C would still be tied to ground, if the filter were to be ground referenced.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of filtering an input current with an RC filter, the method comprising the steps of:

(a) providing the input current to a collector of a first bipolar junction transistor;

(b) grounding an emitter of the first transistor; and (c) connecting a base of the first transistor to an input of the RC filter and to the collector of the first transistor so as to provide a first voltage that is proportional to the logarithm of the input current at the base of the first transistor;

(d) filtering the first voltage with the RC filter; and (e) converting the filtered first voltage to a filtered output current that is proportional to the inverse logarithm of the filtered first voltage.

2. The method of claim 1 wherein the step of filtering is one of low pass, high pass, and bandpass filtering.

3. The method of claim 1 wherein the step of converting the filtered first voltage comprises the steps of:

providing the filtered first voltage to a base of a second bipolar junction transistor;

grounding an emitter of the second transistor; and providing the filtered output current from a collector of the second transistor.

4. The method of claim 1 further comprising the steps of:

converting an input voltage significantly higher than the first voltage to the input current; and converting the filtered output current to a filtered output voltage.

5. The method of claim 1 wherein the filtering step comprises the step of level shifting the first voltage to ground.

6. A method of filtering and reflecting an input current in a subscriber line interface circuit for a telephone system, the input current having been converted from an input voltage, the method comprising the steps of:

(a) converting the input current to a ground referenced first voltage significantly less than the input voltage;

(b) filtering the first voltage; and (c) converting the filtered first voltage to an output current that is a filtered reflection of the input current.

7. The method of claim 6 wherein the input current is converted to the first voltage that is proportional to the logarithm of the input current.

8. The method of claim 7 wherein the input current is converted in a first transistor that provides the first voltage at its base.

9. The method of claim 8 wherein the first transistor has its collector connected to receive the input current.

10. The method of claim 7 wherein the filtered first voltage is converted to the output current that is proportional to the inverse logarithm of the filtered first voltage.

11. The method of claim 10 wherein the filtered first voltage is converted in a second transistor that receives the filtered first voltage at its base.

12. The method of claim 11 wherein the second transistor provides the output current at its collector.

13. A method of reducing a voltage across a capacitor in a filter in a subscriber line interface circuit (SLIC), the method comprising the steps of:

(a) embedding the filter in a current mirror, the current mirror having an input means for reducing an input current to a first voltage proportional to the logarithm of the input current;

(b) providing the first voltage across the capacitor; and (c) providing the filtered first voltage to an output means that provides a filtered reflection of the input current.

14. A method of reducing a power requirement of a resistor in a filter in a subscriber line interface circuit (SLIC), the method comprising the steps of:

(a) embedding the filter in a current mirror, the current mirror having an input means for reducing an input current to a first voltage proportional to the logarithm of the input current;

(b) providing the first voltage across the resistor; and (c) providing the filtered first voltage to an output means that provides a filtered reflection of the input current.

15. A filter for an input signal comprising:

first means for converting the input signal to a first signal that is proportional to the logarithm of the input signal;

a filter for filtering said first signal; and second means for converting said filtered first signal to a filtered output signal that is proportional to the inverse logarithm of said filtered first signal, said second means comprising a second bipolar junction transistor with a base connected to receive said filtered first signal from said filter, a grounded emitter, and a collector that provides said filtered output signal.

16. The filter of claim 15 wherein said first means comprises a first bipolar junction transistor with a collector connected to receive the input signal, a grounded emitter, and a base connected to an input of said filter and to said collector of said first transistor so as to provide said first signal at the base of said first transistor.

17. The filter of claim 15 wherein said filter is a ground referenced RC filter for one of low pass, high pass, and bandpass filtering.

18. The filter of claim 14 wherein the input signal and said filtered output signal are currents and said first signal is a first voltage, and further comprising means for converting an input voltage to the input signal, said input voltage being significantly higher than said first voltage, and means for converting the filtered output signal to a filtered output voltage.

19. In combination, a filter and current mirror for filtering an input voltage that has been converted to an input current, the combination comprising:

first transistor means for converting the input current to a first voltage significantly less than the input voltage, said first transistor means comprising a bipolar junction transistor having its base connected to its collector and to an input of said filter means, and wherein said first voltage is proportional to the logarithm of the input current;

filter means for filtering the first voltage; and second transistor means for converting the filtered first voltage to an output current.

20. The combination of claim 19 wherein said second transistor means comprises a bipolar junction transistor having its base connected to an output from said filter means, and wherein said output current is provided at a collector of said bipolar junction transistor and is proportional to the inverse logarithm of the first filtered voltage.

21. The combination of claim 19 further comprising a third transistor means for providing another said output current.

22. The combination of claim 21 wherein said third transistor means comprises a bipolar junction transistor having its base connected to a base of said second transistor means, and wherein said another output current is provided at a collector of said third transistor means and is proportional to the inverse logarithm of the first filtered voltage.

23. A filter with a reduced voltage capacitor and reduced power resistor for a subscriber line interface circuit (SLIC), the filter comprising a current mirror having an RC filter embedded therein, said current mirror having an input means for reducing an input current to a first voltage proportional to the logarithm of the input current, the first voltage being provided to said RC filter, and said current mirror having an output means that provides a filtered reflection of the input current, whereby the voltage across the capacitor and the power of the resistor are reduced.

24. In combination, a filter and current mirror for filtering an input voltage that has been converted to an input current, the combination comprising:

first transistor means for converting the input current to a first voltage significantly less than the input;

filter means for filtering the first voltage; and second transistor means for converting the filtered first voltage to an output current, wherein said second transistor means comprises a bipolar junction transistor having its base connected to an output from said filter means, and wherein said output current is provided at a collector of said bipolar junction transistor and is proportional to the inverse logarithm of the first filtered voltage.

25. The combination of claim 24 further comprising a third transistor means for providing another said output current, wherein said third transistor means comprises a bipolar junction transistor having its base connected to a base of said second transistor means, and wherein said another output current is provided at a collector of said third transistor means and is proportional to the inverse logarithm of the first filtered voltage.

26. The filter of claim 23 wherein said output means is further for converting said filtered reflection of the input current to an output signal that is proportional to the inverse logarithm of said filtered reflection.

27. The filter of claim 26 wherein said output means comprises a second bipolar junction transistor with a base connected to receive said filtered reflection from said filter, a grounded emitter, and a collector that provides said output signal.

28. The filter of claim 23 wherein said input means comprises a first bipolar junction transistor with a collector connected to receive said input current, a grounded emitter, and a base connected to an input of said filter and to said collector of said first transistor so as to provide said first voltage at the base of said first transistor.

\* \* \* \* \*